(12) United States Patent
Gupta

(10) Patent No.: US 7,494,896 B2
(45) Date of Patent: Feb. 24, 2009

(54) METHOD OF FORMING MAGNETIC RANDOM ACCESS MEMORY (MRAM) DEVICES ON THERMALLY-SENSITIVE SUBSTRATES USING LASER TRANSFER

(75) Inventor: Arunava Gupta, Valley Cottage, NY (US)

(73) Assignee: International Business Machines Corporation, Armonk, NY (US)

( * ) Notice: Subject to any disclaimer, the term of this patent is extended or adjusted under 35 U.S.C. 154(b) by 292 days.

(21) Appl. No.: 10/459,517

(22) Filed: Jun. 12, 2003

(65) Prior Publication Data

US 2004/0252559 A1 Dec. 16, 2004

(51) Int. Cl.
*H01L 21/46* (2006.01)
*H01L 21/30* (2006.01)

(52) U.S. Cl. .............................. 438/455; 438/3; 438/99; 438/458; 438/464

(58) Field of Classification Search ....................... None
See application file for complete search history.

(56) References Cited

U.S. PATENT DOCUMENTS

| | | | | |
|---|---|---|---|---|
| 4,017,265 A | * | 4/1977 | Taylor | 428/675 |
| 6,114,088 A | * | 9/2000 | Wolk et al. | 430/273.1 |
| 6,210,479 B1 | * | 4/2001 | Bojarczuk et al. | 117/84 |
| 6,312,304 B1 | * | 11/2001 | Duthaler et al. | 445/24 |
| 6,372,608 B1 | * | 4/2002 | Shimoda et al. | 438/455 |
| 6,420,242 B1 | * | 7/2002 | Cheung et al. | 438/458 |
| 6,501,143 B2 | * | 12/2002 | Sato et al. | 257/421 |
| 6,521,511 B1 | * | 2/2003 | Inoue et al. | 438/458 |
| 6,723,165 B2 | * | 4/2004 | Ogawa et al. | 117/95 |
| 6,946,178 B2 | * | 9/2005 | Sheats et al. | 428/40.1 |
| 6,972,204 B2 | * | 12/2005 | Oohata et al. | 438/22 |
| 6,992,869 B2 | * | 1/2006 | Suzuki et al. | 360/324.2 |

FOREIGN PATENT DOCUMENTS

KR 2000-0068418 11/2000

OTHER PUBLICATIONS

Supratik Guha et al., "Transplanted Si films on arbitrary using GaN underlayers", Applied Physics Letters, vol. 76, No. 10, Mar. 6, 2000, pp. 1264-1266.

* cited by examiner

*Primary Examiner*—Kiesha Rose
*Assistant Examiner*—Khanh B Duong
(74) *Attorney, Agent, or Firm*—McGinn IP Law Group, PLLC; Ido Tuchman, Esq.

(57) ABSTRACT

A method of forming a magnetic memory device on a substrate includes forming the memory device on a transparent substrate coated with a decomposable material layer subject to rapid heating resulting in a predetermined high pressure, transferring the memory device to the substrate, and forming an organic transistor on the substrate prior to transfer of the magnetic memory device.

22 Claims, 2 Drawing Sheets

METHOD OF FORMING MAGNETIC RANDOM ACCESS MEMORY (MRAM) DEVICES ON THERMALLY-SENSITIVE SUBSTRATES USING LASER TRANSFER

U.S. GOVERNMENT RIGHTS IN THE INVENTION

The subject matter of the present Application was at least partially funded under the Grant No. MDA972-99-C-0009 from the Defense Advanced Research Projects Agency (DARPA), U.S. Department of Defense.

BACKGROUND OF THE INVENTION

1. Field of the Invention

The present invention generally relates to magnetic memory devices, and more particularly to MRAM devices, in which a magnetic tunnel junction (MTJ) device is transplanted onto a thermally-sensitive substrate.

2. Description of the Related Art

MRAMs are presently fabricated on Si for integration of magnetic tunnel junctions (MTJs) with complementary metal oxide semiconductor (CMOS) technology.

MTJ devices can potentially provide nonvolatile, dense, high-performance storage elements. Lower performance applications of MTJs, such as in "smart cards", "wearable sensors", and the like, would require fabrication of such MTJs on flexible, thermally-sensitive substrates, such as polymers and plastics. However, the thermal budget required (e.g., between about 250 to about 400° C.) during processing of the MTJ devices precludes direct fabrication on these substrate materials. That is, the processing of such devices are not compatible with the low-temperature substrates.

Additionally, present day smart cards made of plastic have one or more semiconductor chips, including memory, attached to a module embedded in the card. Having the circuit directly imprinted or bonded to the card would make them more mechanically flexible, durable and lightweight. Cost is also an important factor for low performance application. Replacement of silicon chips with cheaper methods of fabricating memory circuits on plastics would be preferred. However, prior to the invention, no such method has been provided.

SUMMARY OF THE INVENTION

In view of the foregoing and other problems, drawbacks, and disadvantages of the conventional methods and structures, a feature of the present invention is to provide a method and structure in which applications of magnetic memory devices (MRAM device arrays, MRAM stacks, MTJs, etc.) requiring fabrication of such devices (e.g., MTJs etc.) on flexible, standard (e.g., thermally-sensitive such as low-temperature) substrates, such as polymers and plastics, is made possible.

Another feature is to provide a structure and method in which the MTJ device can be fabricated directly on such substrate materials.

In a first exemplary aspect of the present invention, a method of forming a magnetic memory device on a substrate, includes forming the memory device on a transparent substrate coated with a decomposable material layer subject to rapid heating resulting in a predetermined high pressure, transferring the memory device to the substrate, and forming an organic transistor on the substrate prior to transfer of the magnetic memory device.

Thus, with the unique and unobvious aspects of the present invention, magnetic memory devices (e.g., MRAM devices, MRAM stacks, MTJs, etc.) can be formed advantageously on low-temperature substrates such as plastics, polymers, and the like.

Fabrication of memory circuits for low performance applications using the inventive method can lead to lower cost, flexible, durable and lightweight plastic circuits with potential applications for many devices, including smart cards and wearable sensors.

BRIEF DESCRIPTION OF THE DRAWINGS

The foregoing and other purposes, aspects and advantages will be better understood from the following detailed description of exemplary embodiments of the invention with reference to the drawings, in which.

DETAILED DESCRIPTION OF EXEMPLARY EMBODIMENTS OF THE INVENTION

Figure 1:
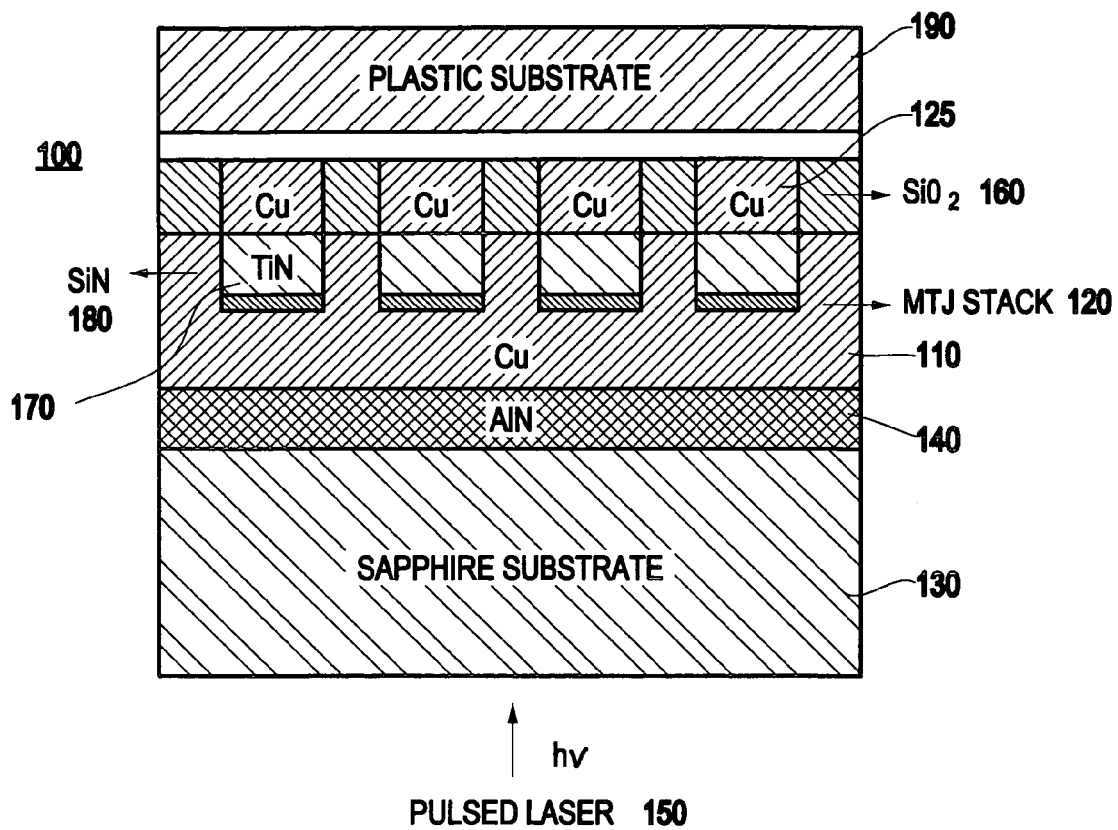
FIG. 1 illustrates an exemplary structure 100 according to an exemplary embodiment of the present invention.
Figure 2:
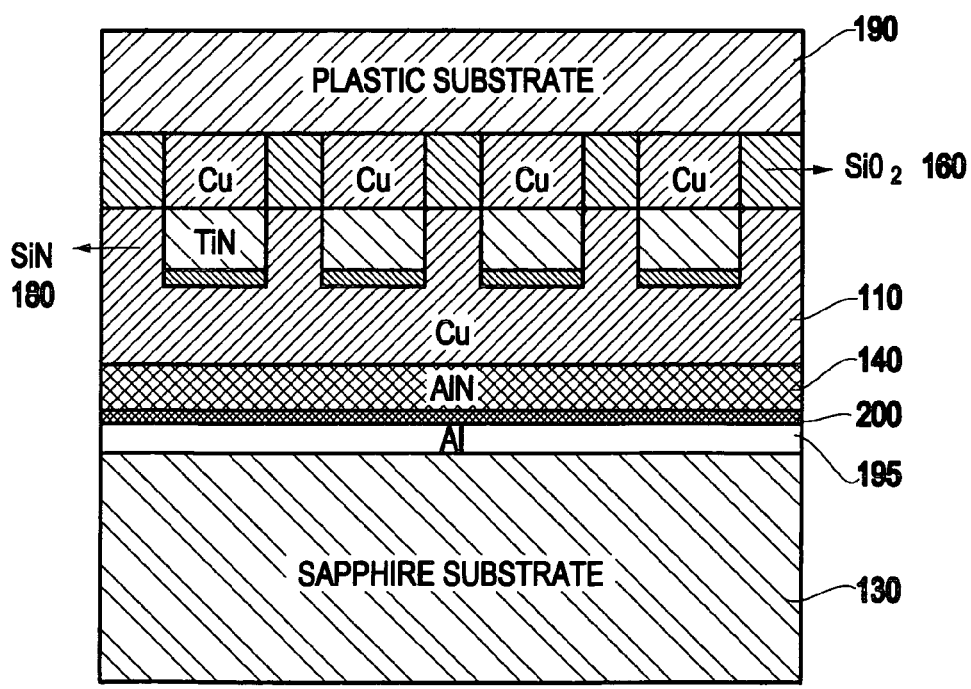
FIG. 2 illustrates the structure 100 after pulsed laser-induced transfer of a magnetic memory device (e.g., an MRAM device array) to a low-temperature substrate, according to an exemplary embodiment of the present invention.
Figure 3:
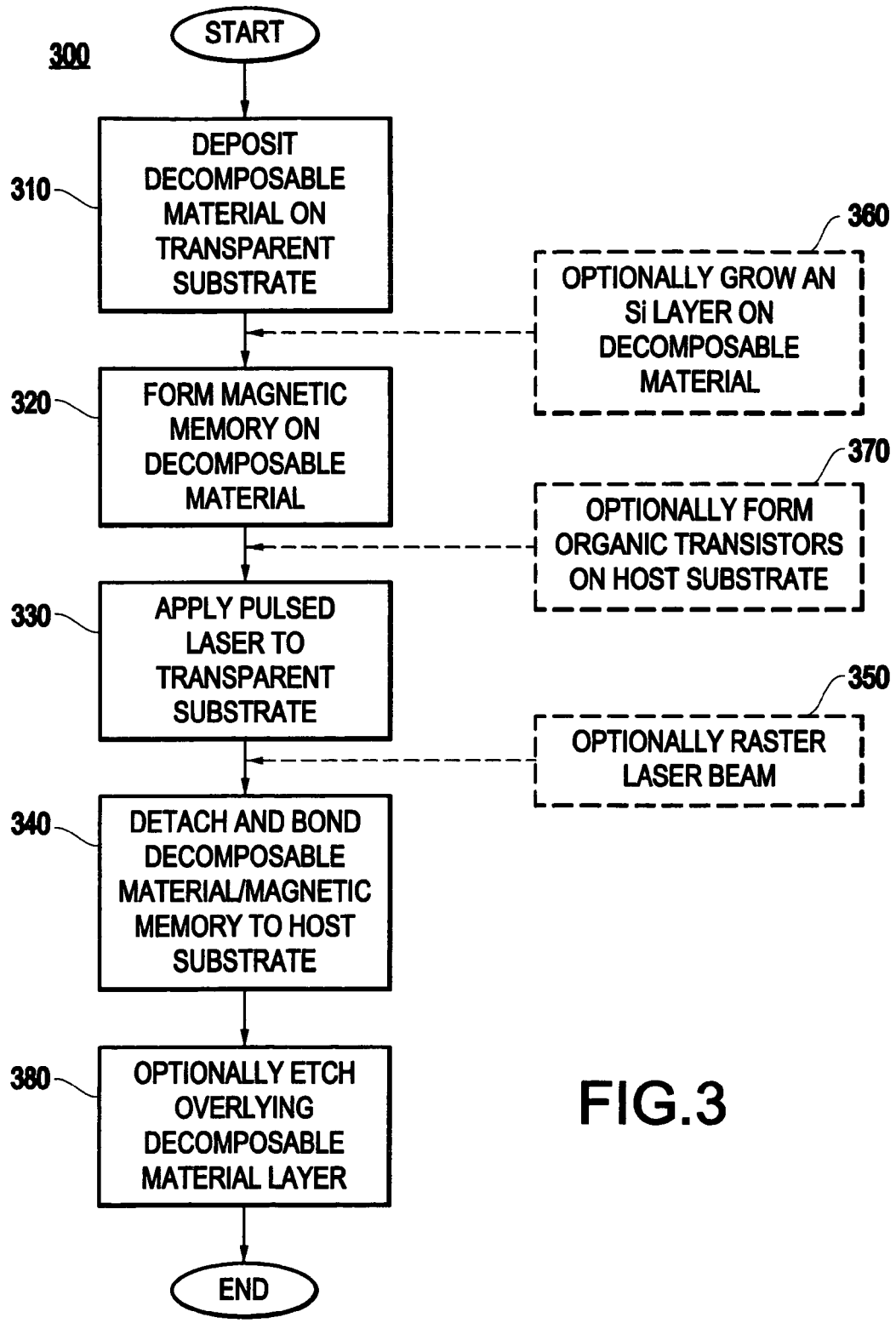
FIG. 3 illustrates a method 300 of forming an MTJ device on a thermally-sensitive substrate according to an exemplary embodiment of the present invention.

Referring now to the drawings, and more particularly to FIGS. 1-3, there are shown exemplary embodiments of the method and structures according to the present invention.

Exemplary Embodiment

As described below, in an exemplary embodiment of the invention, a method of transplanting MTJ devices onto a standard (e.g., thermally-sensitive) substrate is provided, in which an array of devices fabricated, for example, on a transparent substrate (e.g., quartz, sapphire, etc.), are transferred using an exemplary laser lift-off process.

It is again noted that any substrate can be used so long as the substrate is transparent to laser light. That is, depending upon the substrate, an adequate wavelength of light would be found for transmission. Sapphire is preferable since it transfers over a much wider range of wavelengths.

Turning now to the Figures, and more specifically to FIG. 1, an exemplary MRAM device structure 100 is shown.

Structure 100 includes an underlying conductive (e.g., Cu or the like) wiring 110 along with an MTJ cell 120. The MTJ cell typically includes a bottom contact electrode, a bottom magnetic layer, an oxidized Al barrier, a top magnetic layer and a top contact electrode.

The underlying conductive (e.g., Cu or the like) wiring 110 is fabricated on a transparent (e.g., sapphire, quartz, etc.; hereinafter sapphire will be assumed for exemplary purposes only) substrate 130, preferably coated with a thin blanket layer of nitride material 140. The layer of nitride material 140 preferably includes one or more nitride films selected from the group of gallium nitride, aluminum nitride or indium nitride and/or their alloys.

An insulating layer 160 (e.g., $SiO_2$, SiN, SiON, SiONF and/or the like) may be formed between the upper conductive (e.g., Cu) wirings 125 by etching or the like. Additionally, the upper copper wirings 125 may be formed on a conductive nitride material (e.g., TiN, TaN, WN, and/or the like) or other conducting metal or oxide layer 170. Between the TiN 170/MTJ stack 120 is preferably formed an insulating nitride material 180 (e.g., SiN) or an insulating oxynitride (e.g., SiON).

It is known that laser irradiation of the surface of wide-gap InGaAlN films with above (or near)-band-gap photon energies results in the metallization of the nitride following the reaction:

$$XN = X + \tfrac{1}{2}N_2, \text{ where } X \text{ represent Ga, Al, or In.}$$

This has been used advantageously in demonstrating that GaN thin films grown on the transparent (sapphire) substrate can be lifted-off from the substrate by metallizing the interface with a laser probe 150 incident through the backside of the substrate (e.g., sapphire) 130.

This approach also has been extended to show that by using the GaN layer as a template to grow layers of Si, the metallization process can be utilized to lift off overgrown Si layers to be deposited onto arbitrary substrates. Efficient film transfer using AlN, InN and their alloys is also expected.

Thus, FIG. 1 illustrates the application of the pulsed laser 150 applied to the MRAM device array, fabricated on a transparent (e.g., sapphire) substrate 130 for transfer of the MRAM device array to a low-temperature substrate (e.g., plastic, polymer, etc.) 190.

FIG. 2 illustrates the structure after pulse laser-induced transfer of the MRAM device array from the transparent substrate 130 to the low-temperature substrate 190, has occurred. As shown, the magnetic memory (MTJ stack) has been formed on the plastic substrate. Additionally the decomposable material (e.g., the nitride material) has decomposed into its substituents via the release of nitrogen. Hence, in the example shown in FIG. 2, there is an aluminum layer 195, and interfacial layer 200 below the nitride material (e.g., AlN) 140.

Turning now to the method 300 of the invention, the decomposable material (e.g., nitride such as AlN, GaN, and/or InN, and their alloys, etc.) film is deposited on a transparent (e.g., sapphire, quartz, etc.) substrate (step 310). It is noted that the deposition can be performed at relatively low temperatures (e.g., room temperature or near room temperature). However, higher temperature could be employed (e.g., to about for example, 250° C.). Regardless of the host substrate used, it is important that the deposition temperature be below the temperature at which the host substrate would begin to degrade or delaminate.

It is noted that the nitride film should be of sufficient thickness so that the laser light (e.g., depending upon the laser light used) is absorbed in the nitride film. It is noted that some of the nitride may remain on the MRAM after the transfer, and can be removed at that time or left behind. That is, the nitride should not be so thin that the MRAM stack is damaged by the laser light being completely absorbed in the MRAM. Thus, preferably the nitride film has a thickness of about 100 Å to about 2000 Å

In step 320, the magnetic memory device (e.g., MRAM arrays, MRAM stack, MTJs etc. depending upon the desired applications) along with the conductive (e.g., Cu, etc.) wiring are formed on top of the nitride surface. The MRAM device arrays preferably are complete such that substantially no further processing (or minimum processing) is required after the transfer. That is, preferably, the MRAM device is completely fabricated and processed on the sapphire substrate.

During the transfer process, the top copper wiring (with any additional insulating top layer) is mounted face down onto a low-temperature (e.g., polymer or plastic) host substrate in very close proximity. It is preferable to coat a thin layer of an elastomer material, such as polydimethylsiloxane (PDMS) on the host substrate to enable intimate contact between the two substrates during the transfer process. The two surfaces can also be bonded using an epoxy or other mechanism.

In step 330, preferably a single pulse of laser radiation, preferably near or above the band gap of the decomposable material (e.g., nitride), will result in a metallization of the interfacial nitride. It is noted that the laser light may be a patterned beam of laser light on the order of 200-400 mJ/cm$^2$ (e.g., a fairly large beam) useful for the local transfer.

As a result of such metallization, in step 340, the nitride/MRAM structure will detach from the transparent (e.g., sapphire, quartz, etc.) and adhere to the host substrate (e.g., plastic, polymer, etc.). For the laser, preferably an excimer laser is employed, for producing a pulse having a duration on the order of tenths of nanoseconds (or less).

Along these lines, a laser having a wavelength of 193 nm or 248 nm could be used. By the same token, any short pulse laser could be used, which allows the light to be absorbed in the nitride material could be used. Thus, in a very short time period, the thin layer of nitride material is heated up and subsequently decomposed (e.g., broken up into its constituent elements). The debonding occurs due to the pressure build up with the release of nitrogen from the nitride metallization.

It is noted that, by optionally rastering the laser beam, different MRAM arrays can be transferred using single pulses (step 350).

Additionally, by optionally growing an Si layer on top of the nitride (step 360), depending upon the geometry involved, the MRAM devices can also be integrated with transistors to control operation of the cells, which are then be transferred simultaneously. The silicon layer can be epitaxial, polycrystalline, or amorphous depending on the growth temperature of the silicon and the underlying nitride material. Epitaxial-quality wide band gap nitrides can be grown on sapphire. Subsequent growth of silicon on this nitride layer will be substantially single crystal in nature and of better crystalline quality than the amorphous or polycrystalline silicon. Thus, transistors fabricated in the grown silicon with the MRAM devices on top can be transferred at the same time.

Alternatively, optional organic transistors can be fabricated on the host substrate (e.g., the low-temperature substrate such as plastic, polymer, etc.) prior to transfer of the MRAM arrays (step 370) and interconnected with the transferred MRAM structure.

After the transfer process, optionally (e.g., depending on the designer's requirements) the overlying nitride layer can be etched away using established dry or wet etching techniques (step 380).

An issue of the inventive laser transfer process is the temperature rise of the MRAM structure and also that of the host substrate. The temperature rise can be estimated based on the known thermodynamic and thermal properties of the nitride film and the sapphire substrate.

For example, for an energy fluence of ~300 mJ/cm$^2$ from an excimer laser at 248 nm, the maximum temperature rise at a distance of 0.5 µm is about 150° C. for conduction through sapphire (and about 350° C. for conduction through quartz). The temperature is rapidly quenched to below 100° C. (within 0.1 µs) for the case of sapphire. Thus, the temperature rise is not very severe, and can be controlled by the thickness of the nitride layer.

Thus, the invention provides a method (and resulting structure) in which a magnetic memory device (e.g., MRAM device array, MRAM stack, MTJ cell, etc.) is formed on a substrate transparent to laser light, with a thin nitride layer on the bottom which absorbs the laser light and which decomposes due to the high pressure, etc., thereby facilitating the transfer of the MRAM device array to a low-temperature substrate.

While the invention has been described in terms of several exemplary embodiments, those skilled in the art will recognize that the invention can be practiced with modification within the spirit and scope of the appended claims.

Further, it is noted that Applicant's intent is to encompass equivalents of all claim elements, even if amended later during prosecution.

What is claimed is:

1. A method of forming a magnetic memory device on a substrate, comprising:
    forming the memory device onto a transparent substrate coated with a decomposable material layer subject to rapid heating resulting in a predetermined high pressure;
    transferring the memory device to the substrate; and
    forming an organic transistor on the substrate prior to transfer of the magnetic memory device.
2. The method of claim 1, wherein said substrate comprises a plastic substrate.
3. The method of claim 1, wherein said substrate comprises a polymer substrate.
4. The method of claim 1, wherein said transparent substrate comprises a sapphire substrate.
5. The method of claim 1, wherein said transparent substrate comprises a quartz substrate.
6. The method of claim 1, wherein said transparent substrate is transparent to laser light, and said laser light is absorbed by said decomposable material layer, thereby to decompose the decomposable material layer.
7. The method of claim 1, wherein the decomposable material layer is formed on said transparent substrate at a temperature which is below the temperature at which the substrate begins to degrade.
8. The method of claim 1, further comprising:
    forming the magnetic memory device along with a conductive wiring on surface of the decomposable material layer.
9. The method of claim 1, further comprising:
    during the transferring, mounting a top conductive wiring, mounted on said magnetic memory device, onto the substrate.
10. The method of claim 1, further comprising:
    bonding a top conductive wiring mounted face down to the substrate by epoxy.
11. The method of claim 1, further comprising:
    after the transferring, etching the overlying decomposable material layer.
12. The method of claim 1, further comprising:
    controlling a temperature rise in said transparent substrate by adjusting a thickness of the decomposable material layer.
13. The method of claim 1, wherein said decomposable material layer comprises a nitride material.
14. The method of claim 13, wherein said nitride material comprises Gallium nitride.
15. The method of claim 13, wherein said nitride material comprises Aluminum nitride.
16. The method of claim 13, wherein said nitride material comprises Indium nitride.
17. The method of claim 13, wherein said transferring the memory device comprises lifting-off the nitride material from the transparent substrate by metalizing an interface therebetween with a laser radiation incident through a backside of the transparent substrate.
18. The method of claim 17, wherein said laser radiation comprises a single pulse of laser radiation substantially the same or above a band gap of the nitride material.
19. The method of claim 17, further comprising:
    based on said metallization, detaching the nitride material and the magnetic memory device from the transparent substrate; and
    adhering the nitride material and the memory device to the substrate.
20. The method of claim 17, wherein the laser radiation is absorbed in the decomposable material layer, to heat said decomposable material layer and subsequently to decompose said decomposable material layer.
21. The method of claim 20, wherein debonding occurs due to a pressure build up with a release of nitrogen from the metallization.
22. The method of claim 17, further comprising:
    rastering the laser radiation.

* * * * *